(12) United States Patent
Farooq et al.

(10) Patent No.: US 9,673,095 B2
(45) Date of Patent: Jun. 6, 2017

(54) PROTECTED THROUGH SEMICONDUCTOR VIA (TSV)

(71) Applicant: International Business Machines Corporation, Armonk, NY (US)

(72) Inventors: Mukta G. Farooq, Hopewell Junction, NY (US); Jennifer A. Oakley, Poughkeepsie, NY (US); Kevin S. Petrarca, Newburgh, NY (US); Richard P. Volant, Clifton, TN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/177,027

(22) Filed: Jun. 8, 2016

(65) Prior Publication Data

US 2016/0293487 A1    Oct. 6, 2016

Related U.S. Application Data

(62) Division of application No. 14/678,495, filed on Apr. 3, 2015, now Pat. No. 9,401,323.

(51) Int. Cl.
*H01L 21/768* (2006.01)
*H01L 23/48* (2006.01)
*H01L 23/532* (2006.01)

(52) U.S. Cl.
CPC .. *H01L 21/76898* (2013.01); *H01L 21/76852* (2013.01); *H01L 23/481* (2013.01); *H01L 23/53238* (2013.01); *H01L 2924/0002* (2013.01)

(58) Field of Classification Search
CPC ......... H01L 21/76898; H01L 23/53238; H01L 23/481; H01L 21/76852; H01L 21/76841; H01L 23/53223; H01L 23/53266; H01L 28/75; H01L 33/0037
USPC ........................................................ 438/653
See application file for complete search history.

(56) References Cited

U.S. PATENT DOCUMENTS

| | | | |
|---|---|---|---|
| 2004/0016942 A1* | 1/2004 | Miyazawa | H01L 21/268 257/200 |
| 2010/0244247 A1* | 9/2010 | Chang | H01L 21/76898 257/741 |

* cited by examiner

*Primary Examiner* — Walter H Swanson
(74) *Attorney, Agent, or Firm* — Law Offices of Ira D. Blecker, P.C.

(57) ABSTRACT

Method for forming a through semiconductor via (TSV) in a semiconductor wafer comprising: etching an annular recess into a front side of the semiconductor wafer, the annular recess surrounding a pillar of the semiconductor material; filling the annular recess with an insulative material to form an insulative annulus; etching a recess into the front side in the pillar of the semiconductor material; filling the recess in the portion of the semiconductor material with a metal to form a through semiconductor via (TSV); thinning the semiconductor wafer from a backside of the semiconductor wafer and stopping on the insulative annulus to expose the pillar of the semiconductor material; recessing the pillar of the semiconductor material from the back side to form a recess that exposes an end of the TSV; and filling the recess with a metal to a level at least even with a level of the insulative annulus.

20 Claims, 12 Drawing Sheets

PROTECTED THROUGH SEMICONDUCTOR VIA (TSV)

BACKGROUND

The present invention relates to a semiconductor structure, and more specifically, to a protected through silicon via (TSV) for providing vertical interconnection in a semiconductor structure.

In semiconductor technology, a through-silicon via (TSV) is a vertical electrical connection that passes through a silicon wafer, for example. TSV technology is important in creating 3D packages and 3D integrated circuits. A 3D package may contain two or more semiconductor devices stacked vertically.

The through-silicon via technique may form holes in the silicon wafer by etching, for example, and then fill the holes with conductive materials, such as copper, polysilicon or tungsten to form vias or conductive channels. The wafer may be then thinned to be stacked or bonded together to form a 3D stack of semiconductor devices.

Semiconductor wafers are most commonly silicon. It should be noted however that TSVs may be utilized to pass through semiconductor materials other than silicon such as gallium arsenide. In this case, the TSVs may be referred to more generally as through semiconductor vias, still denoted as TSVs.

BRIEF SUMMARY

The various advantages and purposes of the exemplary embodiments as described above and hereafter are achieved by providing, according to one aspect of the exemplary embodiments, there is provided a method for forming a through semiconductor via (TSV) comprising: obtaining a semiconductor wafer having a front side and a back side; etching an annular recess into the front side so as to extend only partially through the semiconductor wafer, the annular recess surrounding a pillar of the semiconductor material; filling the annular recess with an insulative material to form an insulative annulus; etching a recess into the front side in the pillar of the semiconductor material, the recess extending to a depth less than a depth of the insulative annulus in the semiconductor wafer; filling the recess in the portion of the semiconductor material with a metal to form a through silicon via (TSV); thinning the semiconductor wafer from the backside and stopping on the insulative annulus to expose the pillar of the semiconductor material and stopping the thinning before exposing the TSV in the pillar of the semiconductor material; recessing the pillar of the semiconductor material from the back side to form a recess that exposes an end and a side of the TSV; and filling the recess with a metal to a level at least even with a level of the insulative annulus.

According to another aspect of the exemplary embodiments, there is provided a method for forming a through semiconductor via (TSV) in a semiconductor wafer comprising semiconductor material, the method comprising: etching an annular recess into a front side of the semiconductor wafer, the annular recess surrounding a pillar of the semiconductor material; filling the annular recess with an insulative material to form an insulative annulus; etching a recess into the front side in the pillar of the semiconductor material; filling the recess in the portion of the semiconductor material with a metal to form a through semiconductor via (TSV); thinning the semiconductor wafer from a backside of the semiconductor wafer and stopping on the insulative annulus to expose the pillar of the semiconductor material; recessing the pillar of the semiconductor material from the back side to form a recess that exposes an end of the TSV; and filling the recess with a metal to a level at least even with a level of the insulative annulus.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1, 2A to 5A, 2B to 5B and 6 to 11 illustrate a first exemplary process for forming a protected through semiconductor via wherein:

FIG. 1 is a cross sectional view of a semiconductor wafer in which a front end of the line (FEOL) layer and a back end of the line (BEOL) layer have been formed on a front side of the semiconductor wafer;

FIG. 2A is a plan view of a semiconductor wafer and FIG. 2B is a cross sectional view of the semiconductor wafer in the direction of arrows B-B in which an annular recess is formed;

FIG. 5A is a plan view of the semiconductor wafer and FIG. 5B is a cross sectional view of the semiconductor wafer in the direction of arrows B-B in which the recess is filled with a metal to form a through semiconductor via (TSV);

FIG. 6 is a cross sectional view of the structure of FIG. 5B in which the semiconductor wafer has undergone a thinning operation from the back side of the semiconductor wafer;

FIG. 7 is a cross sectional view of the structure of FIG. 6 in which a capping layer and a photoresist layer have been formed on the back side of the semiconductor wafer;

FIG. 8 is a cross sectional view of the structure of FIG. 7 in which the photoresist layer and capping layer have been opened to exposed the pillar of semiconductor material;

FIG. 9 is a cross sectional view of the structure of FIG. 8 in which the pillar of semiconductor material has been recessed;

FIG. 10 is a cross sectional view of the structure of FIG. 9 in which a diffusion barrier has been deposited;

FIG. 11 is a cross sectional view of the structure of FIG. 10 in which a capping metal has been formed in the recess.

FIGS. 12 to 17 illustrate a second exemplary process for forming a protected through semiconductor via wherein:

FIG. 12 is a cross sectional view of the semiconductor wafer similar to FIG. 5B in which the recess is filled with a diffusion barrier and a metal to form a through semiconductor via (TSV);

FIG. 13 is a cross sectional view of the structure of FIG. 12 in which the semiconductor wafer has undergone a thinning operation from the back side of the semiconductor wafer;

FIG. 14 is a cross sectional view of the structure of FIG. 13 in which a capping layer and a photoresist layer have been formed on the back side of the semiconductor wafer;

FIG. 15 is a cross sectional view of the structure of FIG. 14 in which the photoresist layer and capping layer have been opened to exposed the pillar of semiconductor material;

FIG. 16 is a cross sectional view of the structure of FIG. 15 in which the pillar of semiconductor material has been recessed;

FIG. 17 is a cross sectional view of the structure of FIG. 16 in which a diffusion barrier and a capping metal have been formed in the recess.

DETAILED DESCRIPTION

Figure 1:
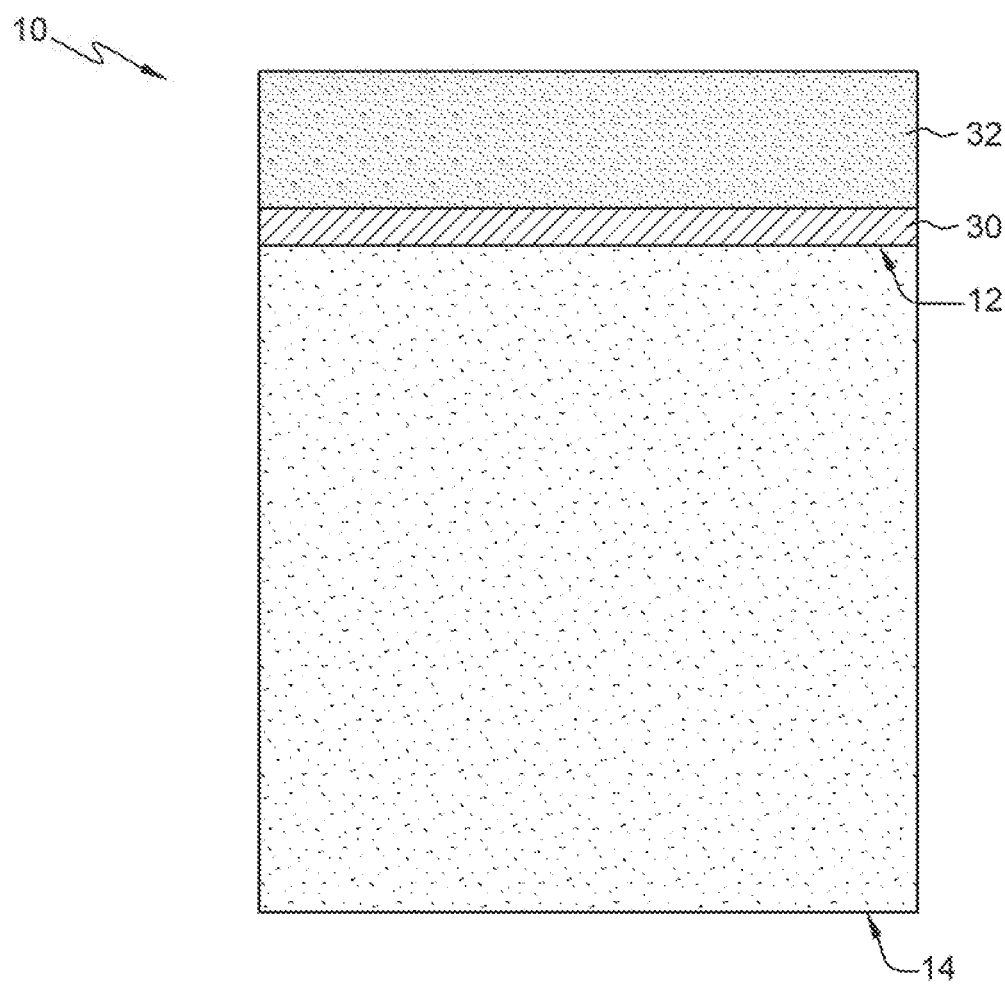

Referring to the Figures in more detail and particularly referring to FIG. 1, there is shown a cross sectional view of a semiconductor wafer 10. The semiconductor wafer 10 has a front "active" side 12 and a back "inactive" side 14. Device components such as transistors, capacitors, etc. may be fabricated on the front side 12 while wafer thinning operations may be performed on the back side 14.

The semiconductor wafer 10 may be any semiconductor wafer that is presently known or may exist in the future. For example, the semiconductor wafer may comprise any semiconductor material including but not limited to group IV semiconductors such as silicon, silicon germanium or germanium, a III-V compound semiconductor, or a II-VI compound semiconductor.

Front end of the line (FEOL) components, such as transistors and the like, may be conventionally added to the front side 12 of the semiconductor wafer 10 to form FEOL layer 30. Modern day semiconductor wafers usually have a back end of the line (BEOL) wiring layer 32, consisting of several wiring sublayers, in which the various FEOL components may be connected. The individual FEOL components in the FEOL layer 30 and the various wiring sublayers in BEOL wiring layer 32 are not shown for clarity.

Forming the FEOL layer and BEOL layer prior to forming the through semiconductor via is a preferred exemplary embodiment. It should be understood that the FEOL layer and BEOL layer may be formed after the forming of the through semiconductor via and then the through semiconductor via may be extended through the FEOL layer and BEOL layer if desired.

Referring now to FIGS. 2A to 5A and 2B to 5B, the "A" Figure is a plan view of a semiconductor wafer 10 and the "B" Figure is a cross sectional view of a portion of a semiconductor wafer 10 in the direction of arrows B-B in the "A" Figure.

Figure 2A:
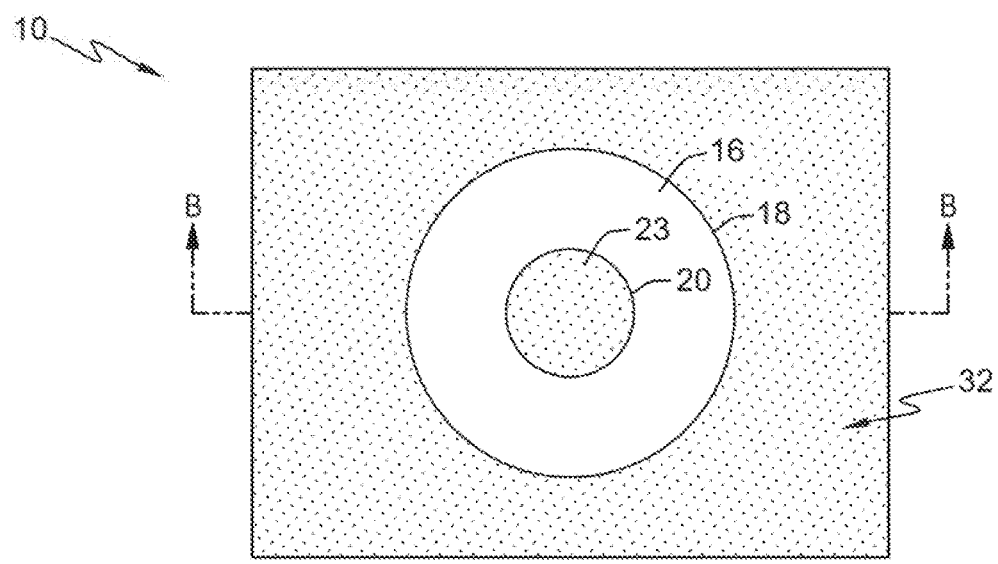
Figure 2B:
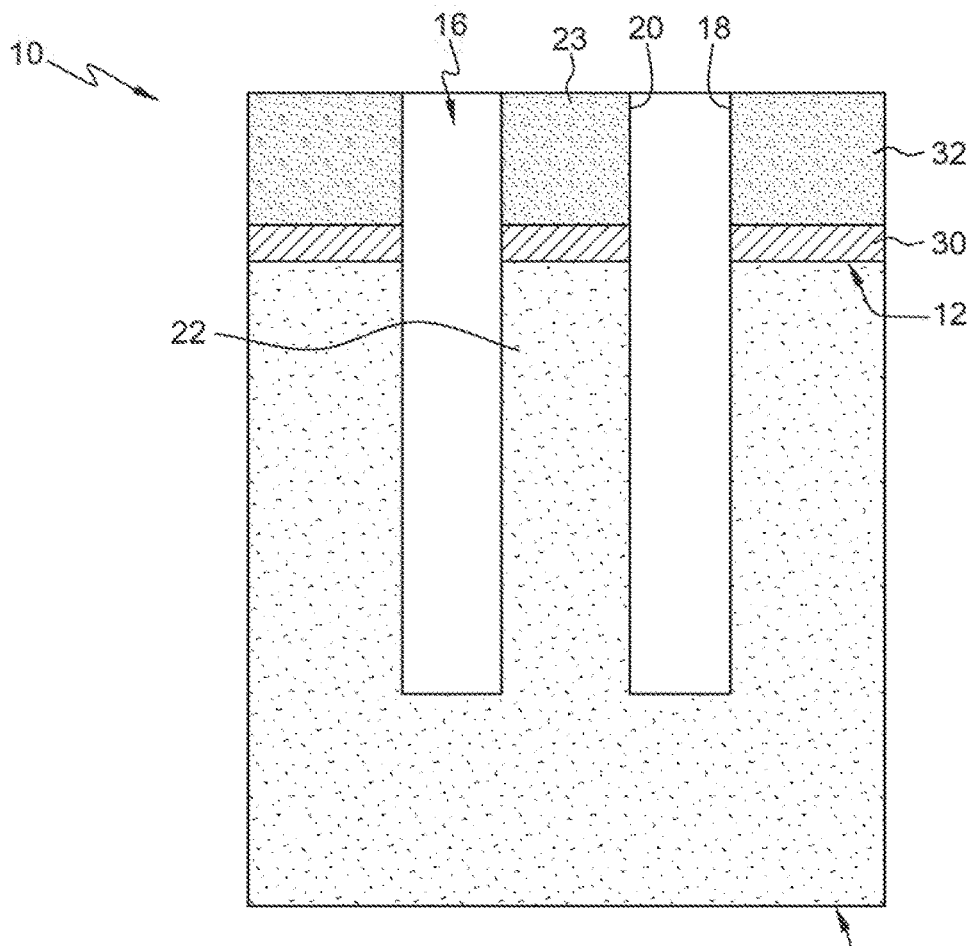

As shown in FIGS. 2A and 2B, an annular recess 16 has been formed in semiconductor wafer 10, including through BEOL layer 32 and FEOL layer 30. The annular recess 16 through the BEOL layer 32 may be formed by a conventional reactive ion etching process typically used during a process to etch through an insulator. The annular recess through the FEOL layer 30 and the body of the semiconductor wafer 10 may be formed by a conventional dry silicon etching process such as a Bosch etch. A Bosch etch is an alternating etch and passivation dry etch to obtain a vertical, or at least near vertical, etch. In actual practice, the etching process to etch through the BEOL layer 32 may also etch through the FEOL layer 30. However, the conventional reactive ion etch to etch through the BEOL layer 32 may form a tapered recess so it is preferred to switch to the Bosch etch to form the vertical or at least near vertical walls of the recess 16 through the silicon of the silicon wafer 10.

Mathematically, an "annulus" is a ring-shaped object, especially a region bounded by two concentric circles. "Annular" is used to refer to an object that is an annulus, as is the annular recess 16 in the exemplary embodiments. In the exemplary embodiments, the outer ring 18 and the inner ring 20 bound the annular recess.

The annular recess 16 extends only part way into the semiconductor wafer 10 from the front side 12. For purposes of illustration and not limitation, semiconductor wafer 10 may have a thickness of about 775 μm (micrometers) and the annular recess 16 may have a depth of about 75 μm. For purposes of illustration and not limitation, the depth of the annular recess 16 has been exaggerated with respect to the thickness of the semiconductor wafer 10. In the center of the annular recess 16 is a pillar 23 of the BEOL layer and a pillar 22 of semiconductor material which is actually a portion of the semiconductor wafer 10 which has not been etched during the formation of the annular recess 16. The pillar 22 of semiconductor material may also include the portion of the FEOL layer directly above the pillar 22.

The inner ring 20 (equivalent to the diameter of the pillar 23 of the BEOL layer and the pillar 22 of semiconductor material) may have a diameter of about 8 μm while the diameter of the outside ring 18 may be about 20 μm. These dimensions are for purposes of illustration and not limitation and may change as the design of the semiconductor wafer 10 may change.

Figure 3A:
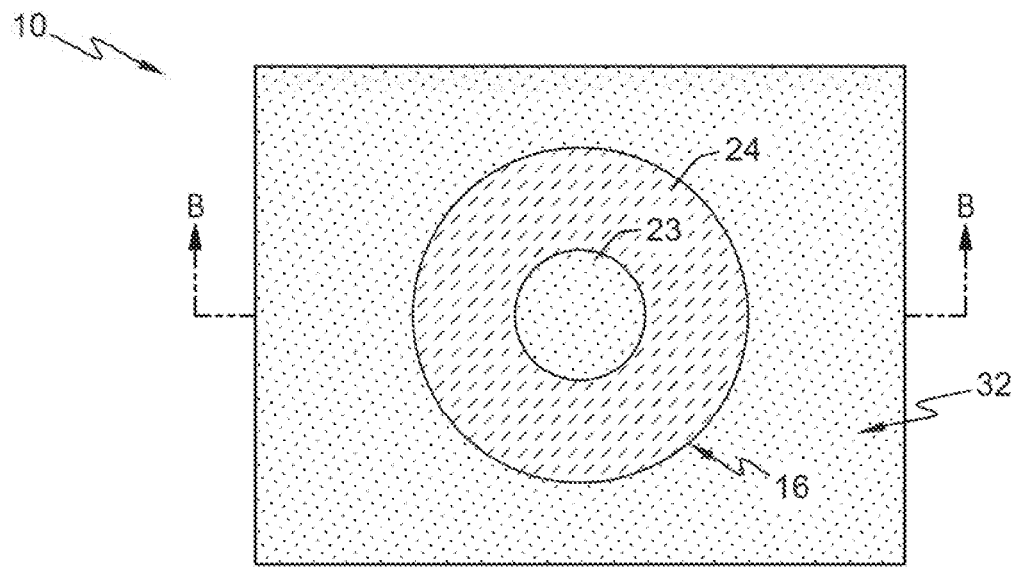
FIG. 3A is a plan view of the semiconductor wafer and FIG. 3B is a cross sectional view of the semiconductor wafer in the direction of arrows B-B in which the annular recess is filled with an insulation material to form an insulative annulus.
Figure 3B:
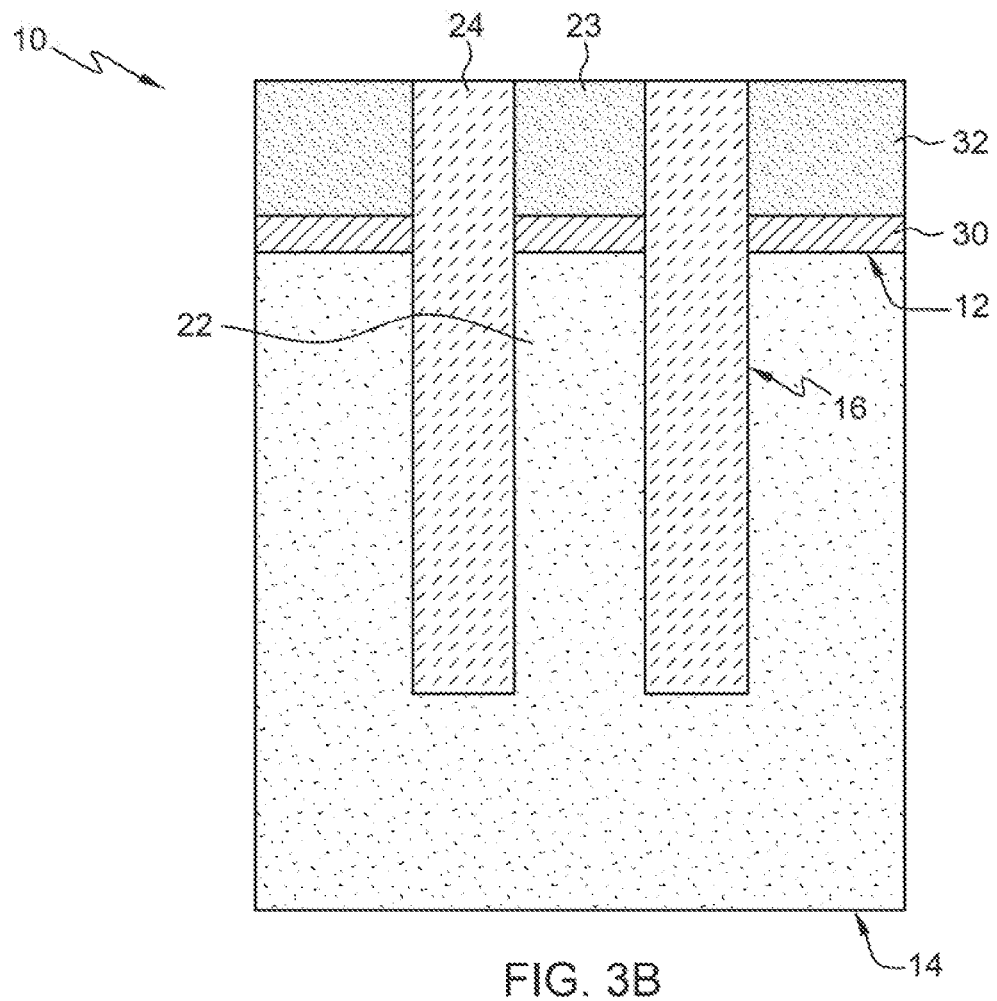

Referring now to FIGS. 3A and 3B, insulator material has been conventionally deposited into the annular recess 16 to form an insulative annulus 24. The insulator material deposited into the annular recess may be, for example, an oxide of silicon. In one exemplary embodiment, the recess 16 may also be lined with silicon nitride before deposition of the oxide of silicon. In a further exemplary embodiment, the recess 16 may be entirely filled with silicon nitride as the insulator material. Any overburden of the insulator material may be removed by a process such as chemical mechanical polishing (CMP).

Normally, a lithographic mask would be provided through which the semiconductor wafer would be etched to form annular recess 16. That lithographic mask may be removed prior to deposition of the insulator material to form the insulative annulus 24. Such well known lithographic processing need not be shown here as it is not germane to the exemplary embodiments.

Figure 4A:
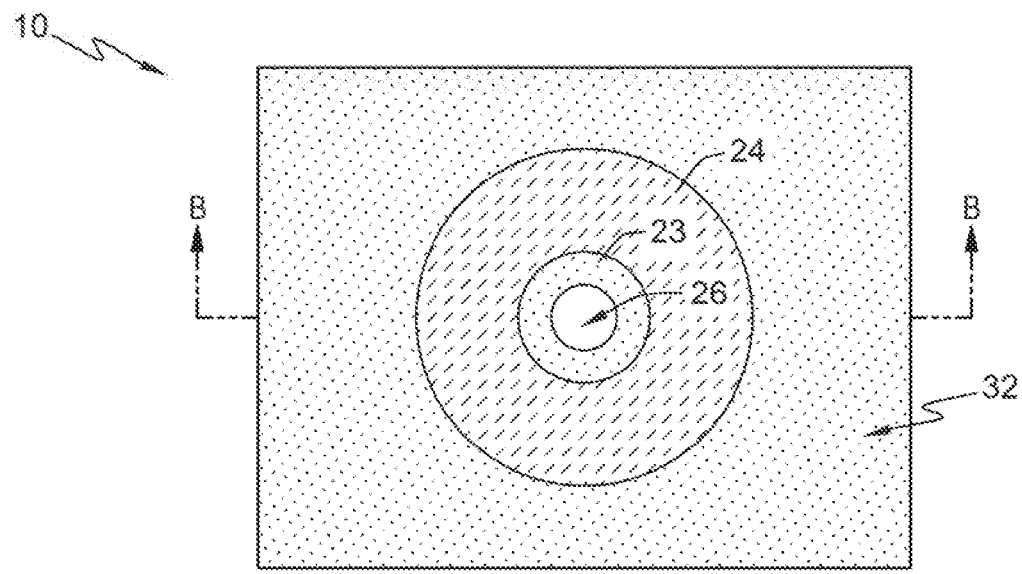
FIG. 4A is a plan view of the semiconductor wafer and FIG. 4B is a cross sectional view of the semiconductor wafer in the direction of arrows B-B in which a pillar of semiconductor material in the center of the insulative annulus is etched through the BEOL layer and FEOL layer to form a recess.
Figure 4B:
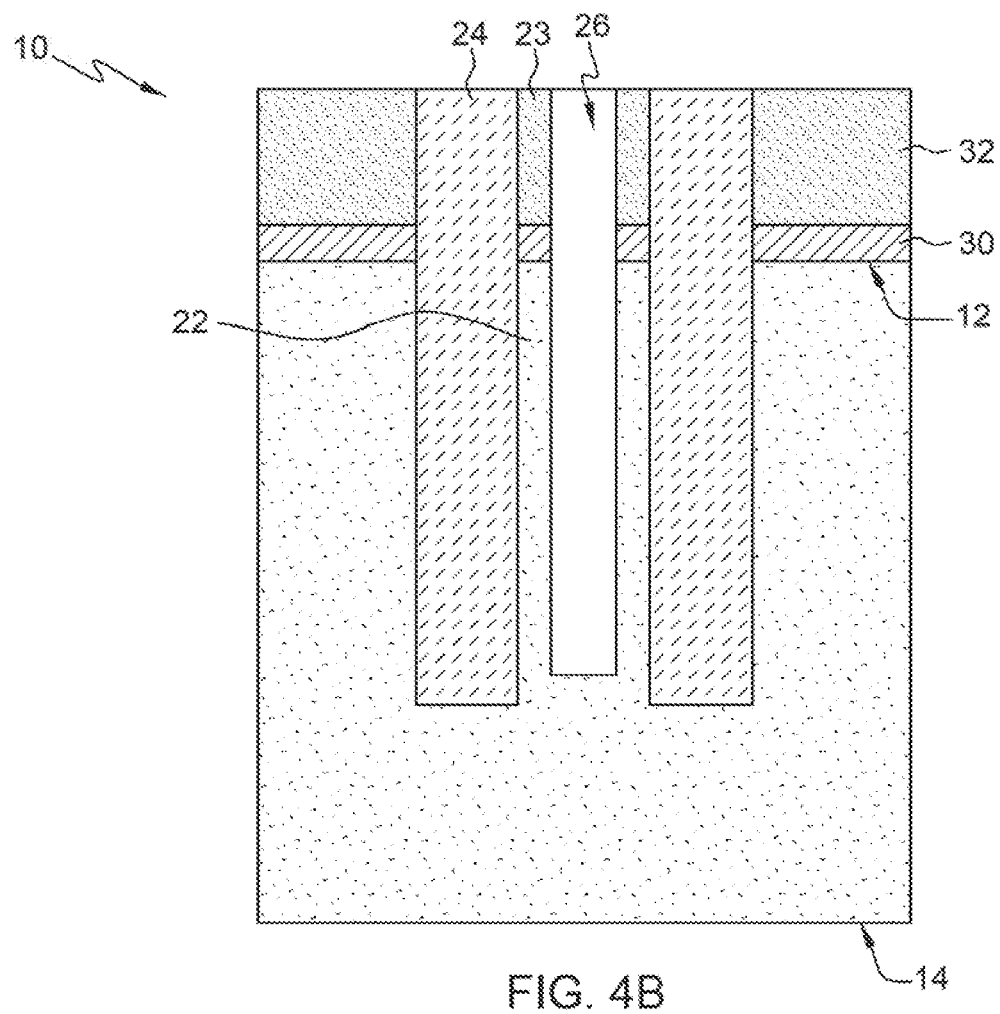

In FIGS. 4A and 4B, the pillar 23 of the BEOL layer and the pillar 22 of semiconductor material have been conventionally etched by processing similar to that of forming recess 16 to now form a recess 26 in the pillar 23 of the BEOL layer and the pillar 22 of semiconductor material. The parameters to etch the recess 26 may be somewhat different than the parameters to etch the annular recess 16 described previously, as would be known by a person skilled in the art, because of the smaller diameter of the recess 26. In one exemplary embodiment, the recess 26 may have a diameter of about 6 μm but the actual diameter of the recess may vary from about 4 μm to 8 μm. Further, the actual diameter should be slightly less than the inner diameter of the annulus which in this exemplary embodiment is 8 μm, so that a portion of the pillar 22 of semiconductor material remains in the final structure. The recess 26 should have a depth that is slightly less than the depth of the insulative annulus 24. For purposes of illustration and not limitation, if the insulative annulus 24 has a depth of 75 µm, the depth of recess 26 may be about 60 µm. As will become apparent hereafter, the insulative annulus 24 protects during backside grinding a via that will be formed in recess 26 by a process to be described hereafter. Thus, the recess 26 should have a depth less (i.e., extend less into the semiconductor wafer 10) than the insulative annulus 24.

Figure 5A:
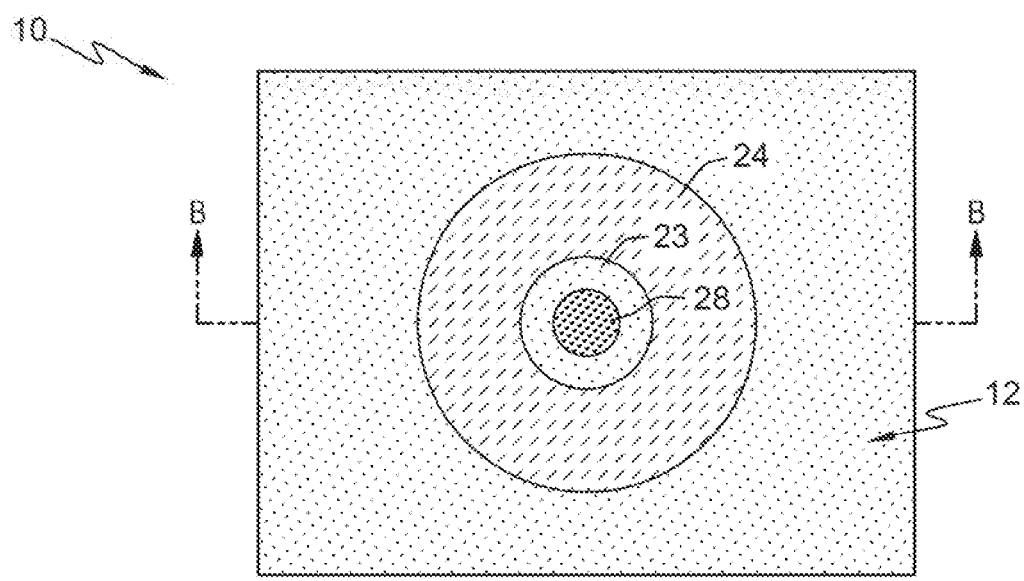
Figure 5B:
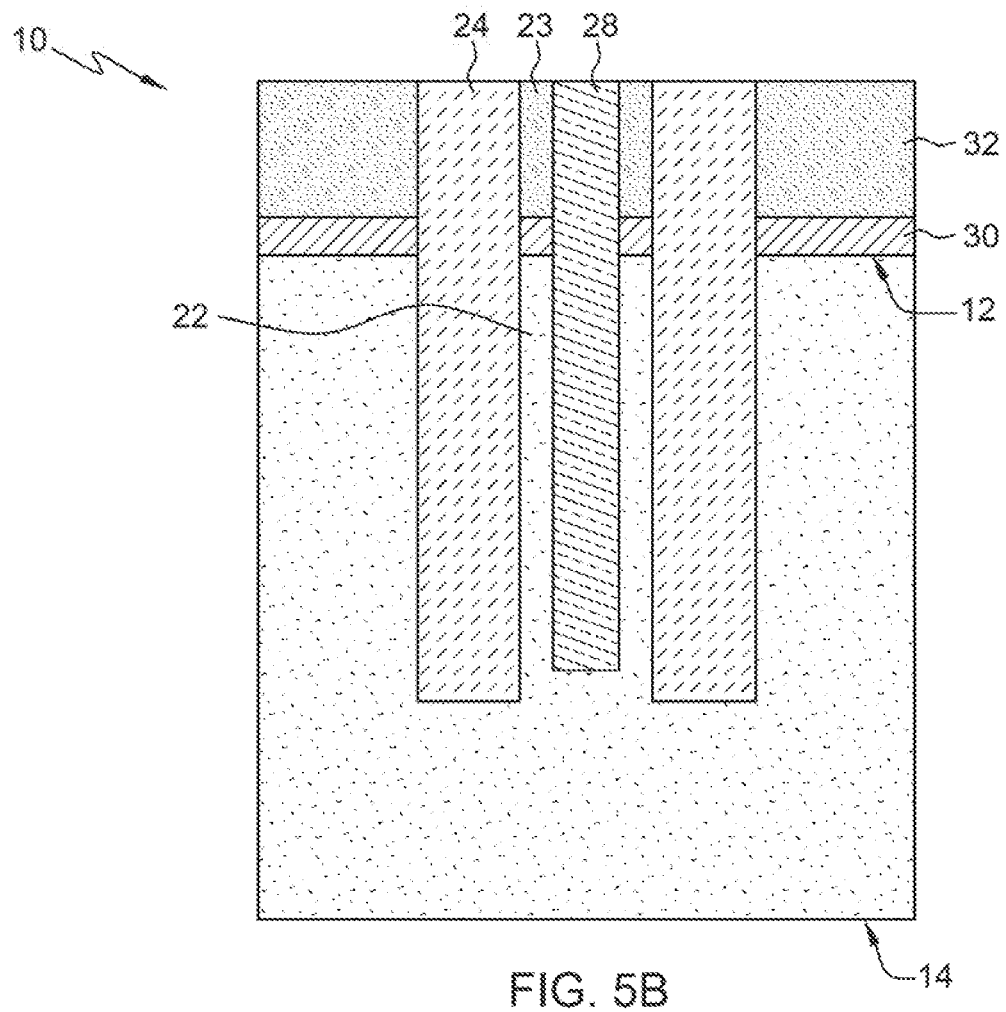

Referring now to FIGS. 5A and 5B, a metal, preferably copper, has been deposited into recess 26 by conventional means, for example such as electro chemical deposition (ECD). While copper is preferred, in some exemplary embodiments tungsten may also be used to fill recess 26. Any overburden may be removed by a conventional CMP process. Prior to deposition of the metal to form the via 28, a diffusion barrier (not shown) may be conventionally deposited on the sides and bottom of the recess 26. Such a diffusion barrier may include, for example, combinations of tantalum nitride/tantalum and titanium nitride/tantalum. The via 28 is surrounded by the unetched portion of pillar 23 of the BEOL layer and the unetched portion of pillar 22 of semiconductor material.

Normally, a lithographic mask would be provided through which the pillar 23 of the BEOL layer and the pillar 22 of semiconductor material may be etched to form recess 26. That lithographic mask may be removed prior to deposition of the metal to form the via 28. Such well known lithographic processing need not be shown here as it is not germane to the exemplary embodiments.

Figure 6:
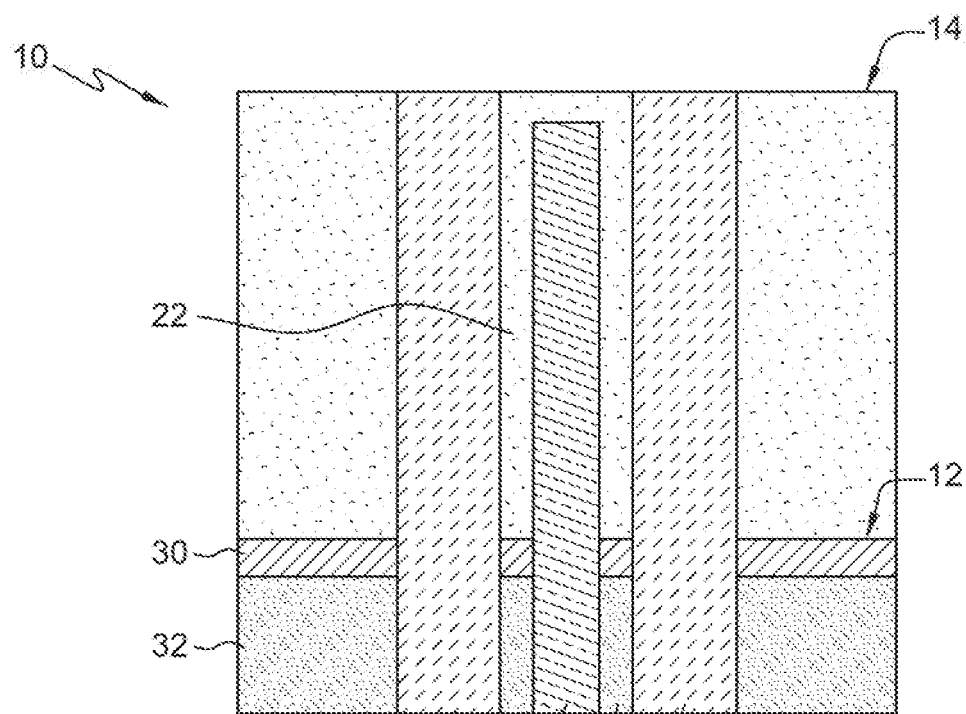

In one exemplary embodiment, the semiconductor wafer 10 may be flipped over for thinning of the semiconductor wafer 10. Thinning of the semiconductor wafer 10 may be by a conventional grinding process. Referring now to FIG. 6, the semiconductor wafer 10 has been thinned by a grinding process which stops on the insulative annulus 24.

As noted previously, the via 28 has a smaller depth than insulative annulus 24. This difference in depth is important for two reasons. The first reason is that the difference in depth allows for some process variation without adversely affecting the via 28. The second reason is that during the backside grinding process, the via 28 is protected from contact during the backside grinding process. The via 28 in one exemplary embodiment may have a diameter of about 4 to 8 µm which may be susceptible to breaking off during the backside grinding process so protecting the via 28 during the backside grinding process is very important.

Figure 7:
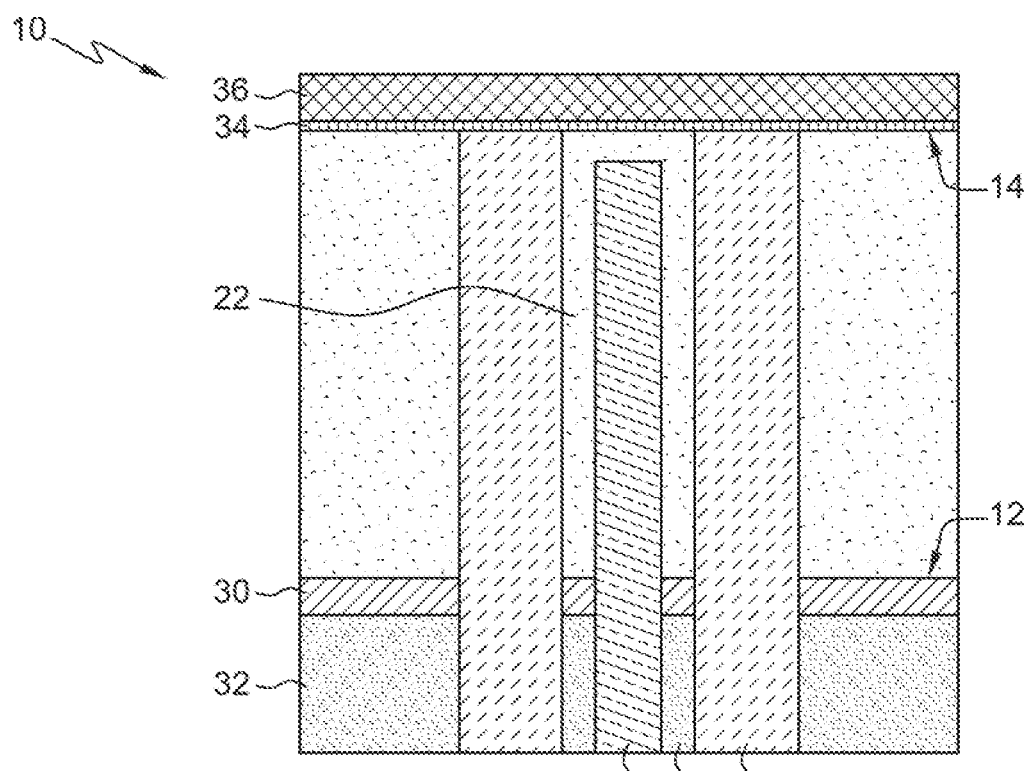

In a next process, referring now to FIG. 7, a capping layer 34 may be blanket deposited on the back side 14 of the semiconductor wafer 10 followed by a layer of photoresist 36. The capping layer 34 may comprise an oxide or a nitride and may have a thickness of about 25 to 100 nanometers.

Figure 8:
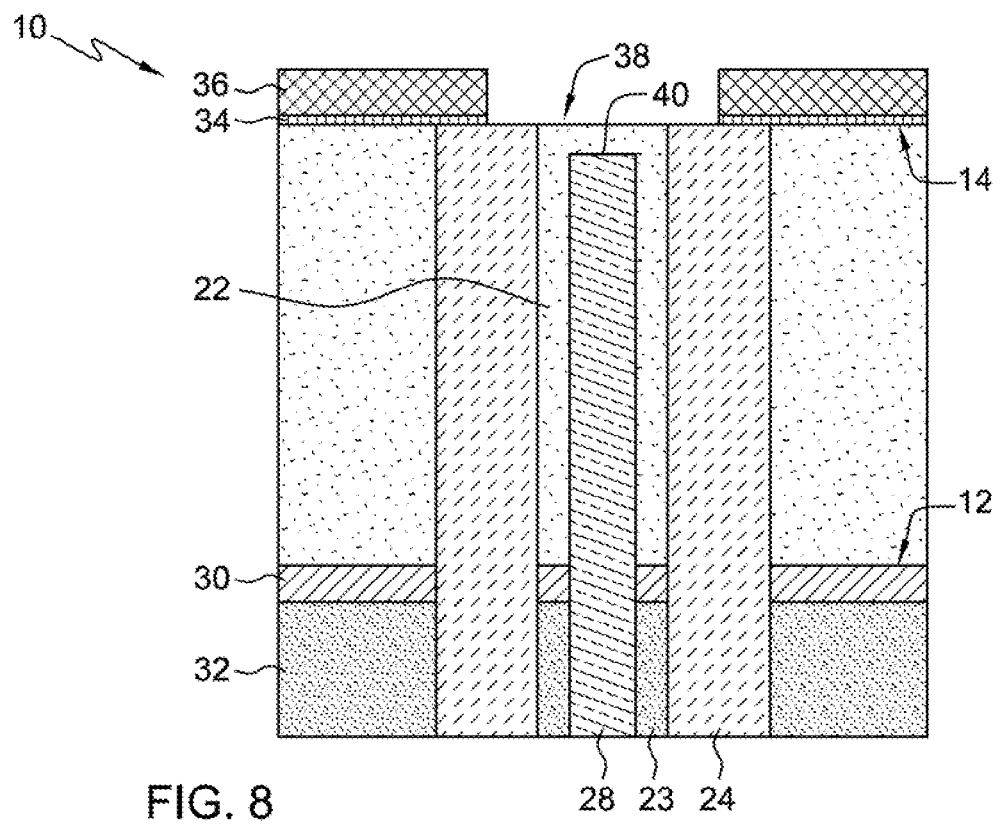

Thereafter, the photoresist 36 may be exposed and developed to create an opening 38 through which the capping layer 34 may be conventionally etched to expose the pillar 22 of semiconductor material within the insulative annulus 24 as shown in FIG. 8. The pillar 22 of semiconductor material while exposed to the opening 38 also covers an end 40 of the via 28.

Figure 9:
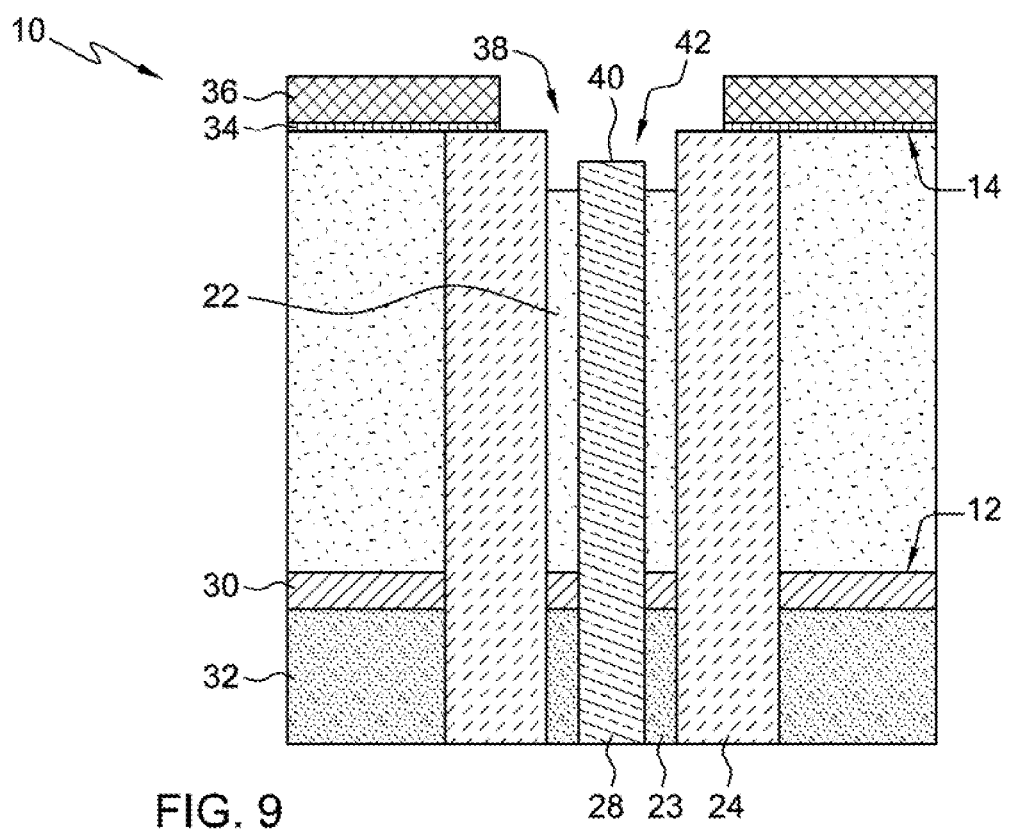

In order for the via 28 to be electrically connected, the end 40 of the via 28 may need to be exposed. Accordingly, as shown in FIG. 9, the pillar 22 of semiconductor material may be etched by a silicon reactive ion etching process to pull back the pillar 22 of semiconductor material to form recess 42. It is noted that the end 40 of the via 28 is now exposed. Etching of the pillar 22 of semiconductor material is continued to make sure that enough of the end 40 of the via 28 is exposed. About 5 µm of the end 40 of the via 28 may be exposed after etching of the pillar 22 of semiconductor material.

Figure 10:
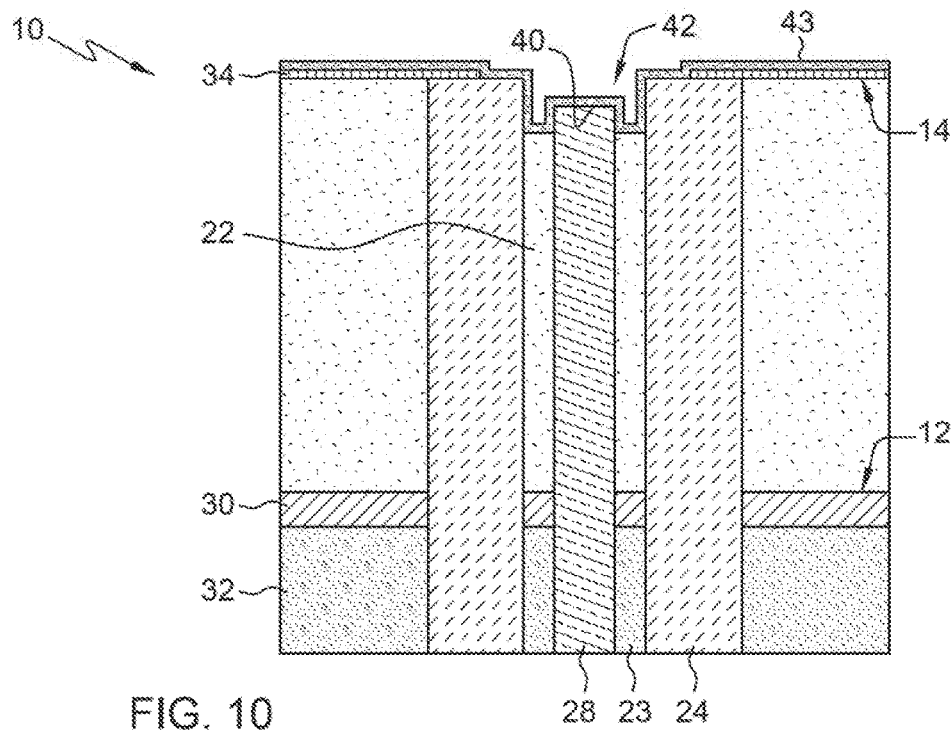
Figure 11:
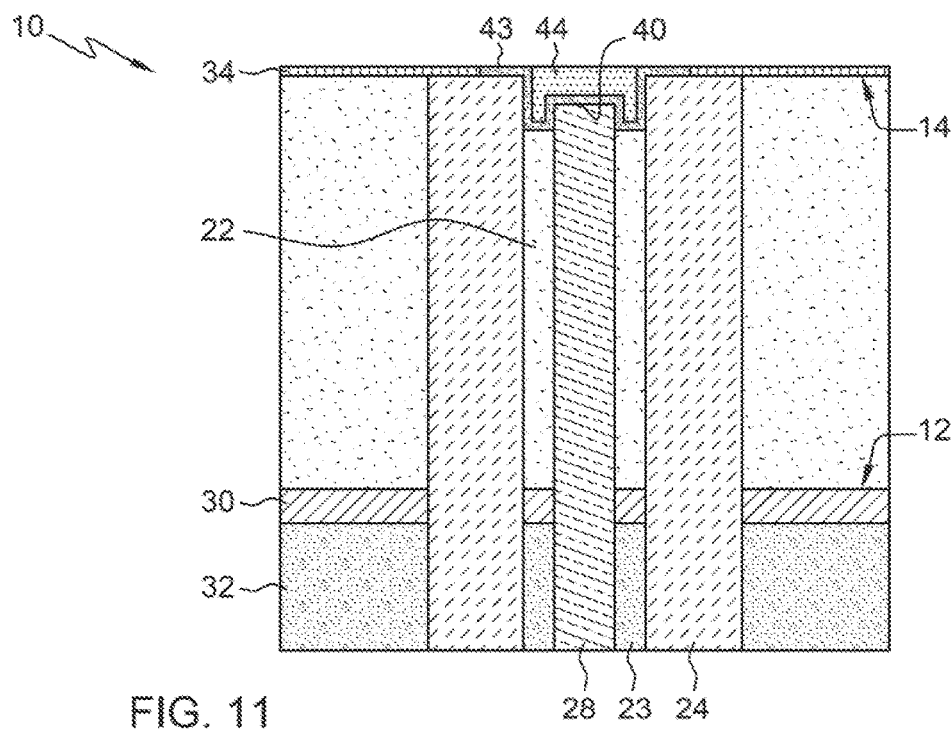

After the formation of the recess 42 shown in FIG. 9, the photoresist 36 may be conventionally stripped. Referring now to FIG. 10, a conductive diffusion barrier 43, such as tantalum nitride/tantalum, may be deposited within recess 42 and over capping layer 34. Then, as shown in FIG. 11, a capping metal 44, preferably copper, but could also be tungsten or nickel, may be blanket deposited over capping layer 34 and diffusion barrier 43 and into recess 42. Any overburden of the capping metal 44 and diffusion barrier 43 may be conventionally removed by a CMP process, stopping on the capping layer 34 to result in the structure shown in FIG. 11.

Further processing may continue to form other redistribution wiring sublayers, to form passive circuits such as inductors or to form pads for C-4 connections.

The via 28 may be subsequently connected to other semiconductor chips (not shown) or semiconductor wafers (not shown) to form 3D integrated circuit chips and/or 3D integrated circuit packages.

Figure 12:
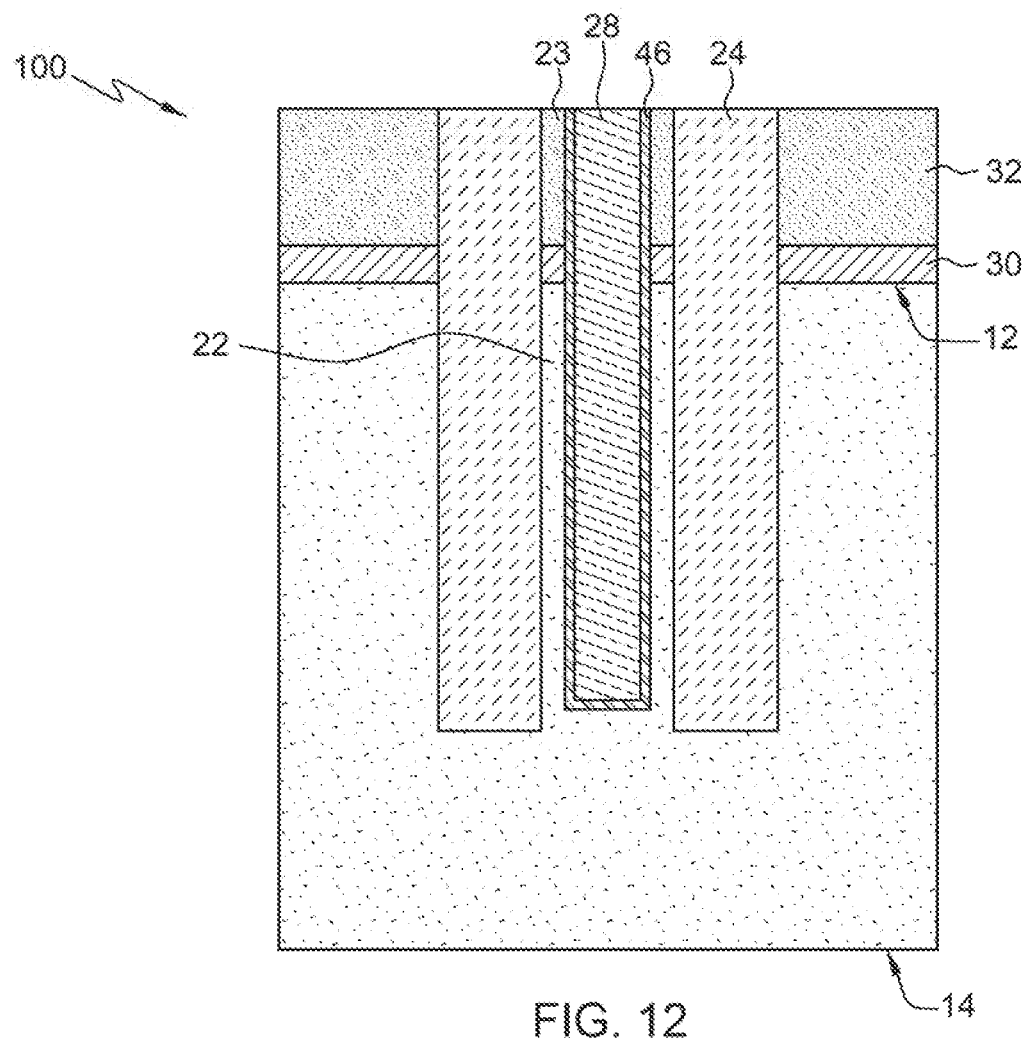

As noted previously, the via 28 in one exemplary embodiment may have a diffusion barrier. Referring to FIGS. 12 to 17, there is illustrated a second exemplary embodiment in which the semiconductor wafer 100 may have a diffusion barrier formed on via 28. Referring first to FIG. 12, which is a view similar to FIG. 5B, an insulative annulus 24 and via 28 have been formed in semiconductor wafer 100. In this second exemplary embodiment, a diffusion barrier 46, for example tantalum nitride/tanlalum or titanium nitride/tantalum as described previously, has been formed on the sidewalls of the recess 26 (recess 26 as shown in FIG. 4B) prior to deposition of the metal fill. The via 28 now includes the diffusion barrier 46.

Figure 13:
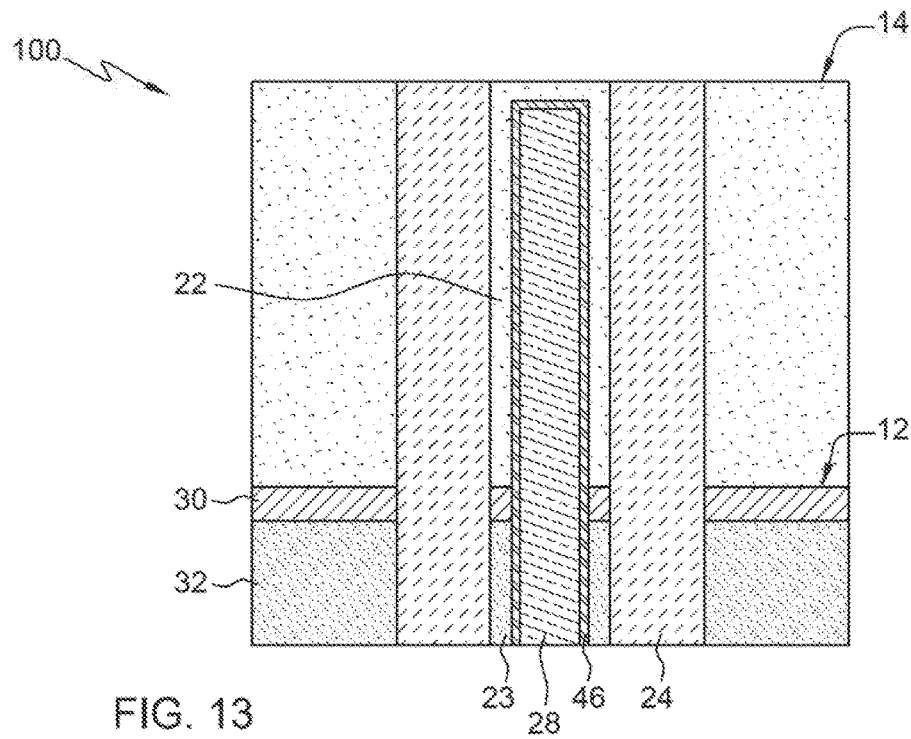

As shown in FIG. 13, the semiconductor wafer 100 has been thinned from the backside 14 stopping on the insulative annulus 24.

Figure 14:
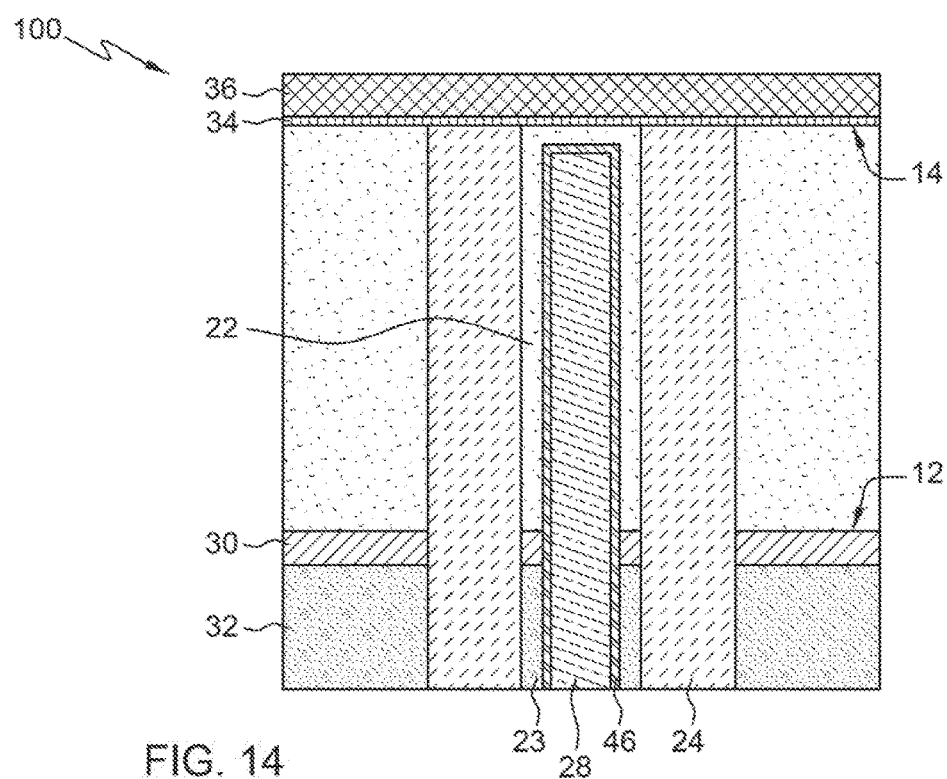
Figure 15:
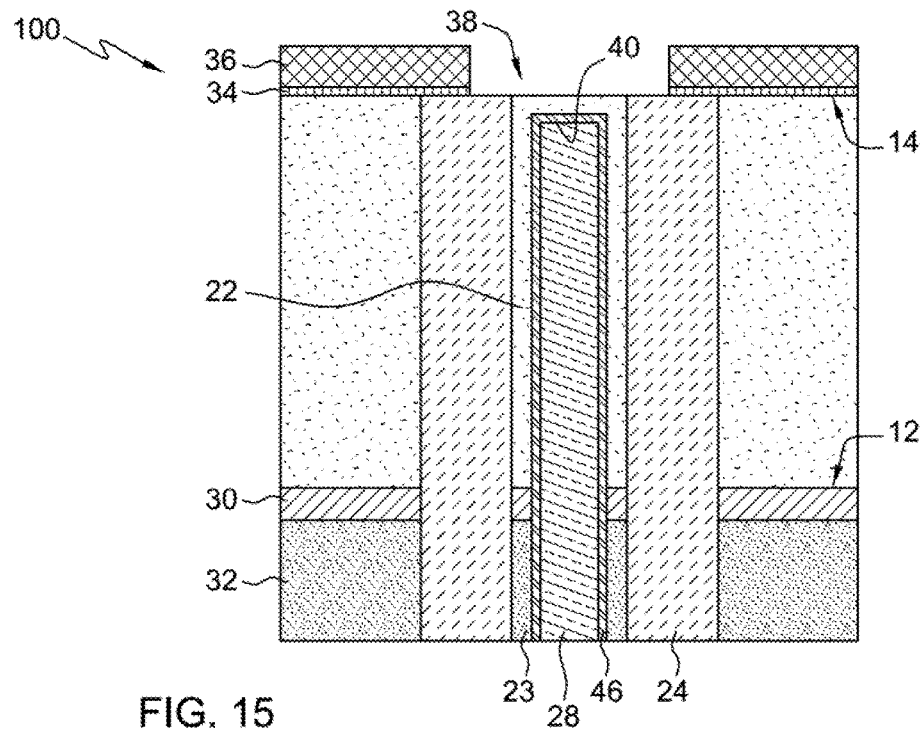

Referring now to FIG. 14, the capping layer 34 and photoresist 36 have been formed on the backside of the semiconductor wafer 100 and in FIG. 15, the photoresist 36 and capping layer 34 have been opened to expose the pillar 22 of semiconductor material through opening 38.

Figure 16:
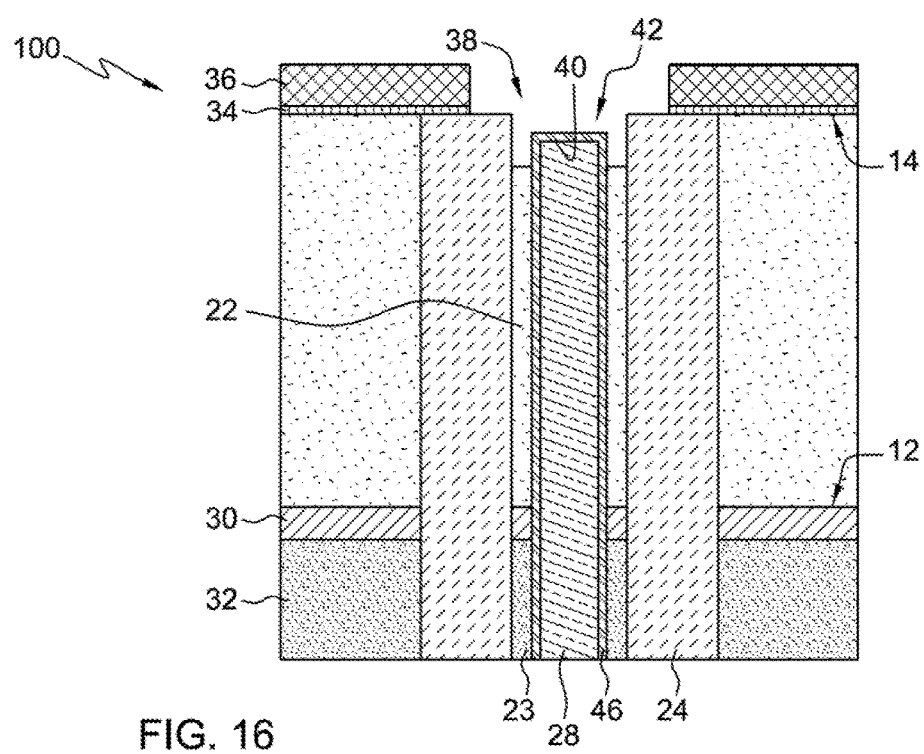

In FIG. 16, the pillar 22 of semiconductor material has been etched to pull back the pillar of semiconductor to form recess 42. The end 40 of the via 28 is now exposed. The diffusion barrier 46 on the via 28, which preferably comprises copper, facilitates the reactive ion etching of the pillar 22 of semiconductor material.

Figure 17:
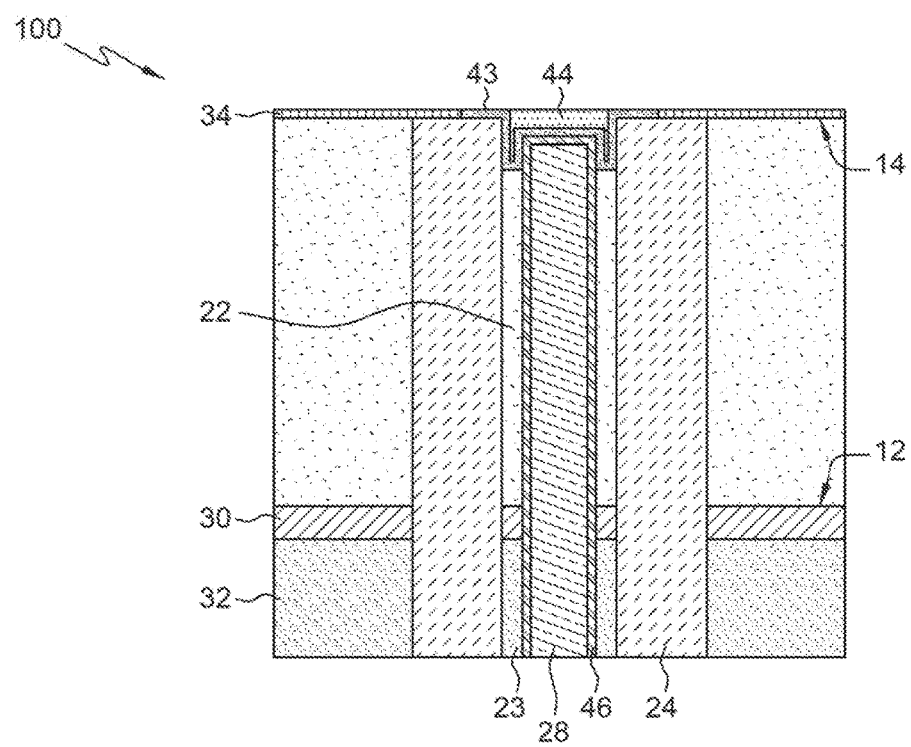

Referring now to FIG. 17, the photoresist 36 has been stripped followed by deposition of a conductive diffusion barrier 43 and a capping metal 44, preferably copper, over capping layer 34 and into recess 42. Any overburden of the capping metal 44 and diffusion barrier 43 may be conventionally removed by a CMP process, stopping on the capping layer 34 to result in the structure shown in FIG. 17.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method for forming a through semiconductor via (TSV) comprising:

obtaining a semiconductor wafer comprising a semiconductor material having a front side and a back side;
etching an annular recess into the front side so as to extend only partially through the semiconductor wafer, the annular recess surrounding a pillar of the semiconductor material;
filling the annular recess with an insulative material to form an insulative annulus;
etching a recess into the front side in the pillar of the semiconductor material, the recess extending to a depth less than a depth of the insulative annulus in the semiconductor wafer;
filling the recess in the portion of the semiconductor material with a metal to form a through semiconductor via (TSV);
thinning the semiconductor wafer from the back side and stopping on the insulative annulus to expose the pillar of the semiconductor material and stopping the thinning before exposing the TSV in the pillar of the semiconductor material;
recessing the pillar of the semiconductor material from the back side to form a recess that exposes an end and a side of the TSV; and
filling the recess with a metal to a level at least even with a level of the insulative annulus.

2. The method of claim 1 wherein before recessing the pillar of the semiconductor material further comprising forming a capping layer comprising nitride or oxide on the back side; and forming an opening in the capping layer, wherein recessing the pillar of the semiconductor material comprises recessing the pillar of the semiconductor material through the opening in the capping layer and wherein filling the recess comprises filling the recess with a metal to a level even with the capping layer.

3. The method of claim 1 further comprising forming a diffusion barrier liner between the TSV and the pillar of the semiconductor material.

4. The method of claim 1 wherein the semiconductor wafer comprises a front end of the line (FEOL) layer comprising at least one semiconductor device on the front side and wherein etching a recess into the front side includes etching a recess through the FEOL layer.

5. The method of claim 4 wherein the semiconductor wafer comprises a back end of the line (BEOL) wiring layer on the FEOL layer and wherein etching a recess into the front side includes etching a recess through the BEOL wiring layer.

6. The method of claim 1 wherein the metal TSV has a diameter of 4 to 8 µm.

7. The method of claim 1 wherein between etching the recess into the front side and filling the recess in the portion of the semiconductor material, further comprising forming a liner of a diffusion barrier in the recess into the front side.

8. The method of claim 7 wherein between recessing the pillar of the semiconductor material and filling the recess with the metal, further comprising forming a conductive diffusion barrier lining the recess.

9. The method of claim 1 wherein the insulative material comprises an oxide of silicon.

10. The method of claim 1 wherein the insulative material comprises silicon nitride.

11. A method for forming a through semiconductor via (TSV) in a semiconductor wafer comprising semiconductor material, the method comprising:
etching an annular recess into a front side of the semiconductor wafer, the annular recess surrounding a pillar of the semiconductor material;
filling the annular recess with an insulative material to form an insulative annulus;
etching a recess into the front side in the pillar of the semiconductor material;
filling the recess in the portion of the semiconductor material with a metal to form a through semiconductor via (TSV);
thinning the semiconductor wafer from a backside of the semiconductor wafer and stopping on the insulative annulus to expose the pillar of the semiconductor material;
recessing the pillar of the semiconductor material from the backside to form a recess that exposes an end of the TSV; and
filling the recess with a metal to a level at least even with a level of the insulative annulus.

12. The method of claim 11 wherein before recessing the pillar of the semiconductor material further comprising forming a capping layer comprising nitride or oxide on the backside; and forming an opening in the capping layer, wherein recessing the pillar of the semiconductor material comprises recessing the pillar of the semiconductor material through the opening in the capping layer and wherein filling the recess comprises filling the recess with the metal to a level even with the capping layer.

13. The method of claim 11 further comprising forming a diffusion barrier liner between the TSV and the pillar of the semiconductor material.

14. The method of claim 11 wherein the semiconductor wafer comprises a front end of the line (FEOL) layer comprising at least one semiconductor device on the front side and wherein etching a recess into the front side includes etching the recess through the FEOL layer.

15. The method of claim 14 wherein the semiconductor wafer comprises a back end of the line (BEOL) wiring layer on the FEOL layer and wherein etching the recess into the front side includes etching the recess through the BEOL wiring layer.

16. The method of claim 11 wherein the metal TSV has a diameter of 4 to 8 µm.

17. The method of claim 11 wherein between etching the recess into the front side and filling the recess in the portion of the semiconductor material, further comprising forming a liner of a diffusion barrier in the recess into the front side.

18. The method of claim 17 wherein between recessing the pillar of the semiconductor material and filling the recess with the metal, further comprising forming a conductive diffusion barrier lining the recess.

19. The method of claim 11 wherein the insulative material comprises an oxide of silicon.

20. The method of claim 11 wherein the insulative material comprises silicon nitride.

* * * * *